(12) United States Patent
Wen

(10) Patent No.: US 6,500,714 B1
(45) Date of Patent: Dec. 31, 2002

(54) METHOD AND STRUCTURE FOR MANUFACTURING ROMS IN A SEMICONDUCTOR PROCESS

(75) Inventor: Wen-Ying Wen, Kaohsiung Hsien (TW)

(73) Assignee: Windbond Electronics Corp., Hsinchu (TW)

( * ) Notice: Subject to any disclaimer, the term of this patent is extended or adjusted under 35 U.S.C. 154(b) by 0 days.

(21) Appl. No.: 09/607,769

(22) Filed: Jun. 30, 2000

(51) Int. Cl.[7] .......................................... H01L 21/8234
(52) U.S. Cl. ....................... 438/275; 438/396; 257/375; 257/316
(58) Field of Search ................................ 257/315, 316; 438/396, 586, 275

(56) References Cited

U.S. PATENT DOCUMENTS 5,712,500 A * 1/1998 Hsue et al. .................. 257/315
5,721,442 A * 2/1998 Hong .......................... 257/316

* cited by examiner

Primary Examiner—David Nelms
Assistant Examiner—Rene' R Berry
(74) Attorney, Agent, or Firm—Ladas & Parry

(57) ABSTRACT

In a traditional ROM semiconductor process, ROM codes are performed by ion implantation. Due to the limitations of ion implantation energy and threshold control, the implantation for program codes must be performed before forming an inter-layer oxide layer. Therefore, the required delivery time of the process becomes longer. The invention provide a method of manufacturing ROMs that can shorten delivery time by using only one mask to simultaneously form program codes and contact windows.

15 Claims, 3 Drawing Sheets

US 6,500,714 B1

METHOD AND STRUCTURE FOR MANUFACTURING ROMS IN A SEMICONDUCTOR PROCESS

BACKGROUND OF THE INVENTION

1. Field of the Invention

The invention relates to a semiconductor process, and particularly to a method and a structure for manufacturing ROMs requiring a shorter delivery time in a semiconductor process.

2. Description of the Related Art

FIG. 1 is a circuit diagram showing a traditional ROM, wherein reference symbols BL1~BL4, WL1~WL4 and 0 and 1 represent N$^+$-type bit lines, word lines and program codes, respectively. FIG. 2 is a top view showing the structure of the traditional ROM of FIG. 1. In FIG. 2, reference symbols 10, 12, BL1~BL4 and WL1~WL4 represent a P-type substrate, code implanted regions, N$^+$-type bit lines and gates (word lines), respectively. Generally, in a ROM process according to the prior art, a plurality of N$^+$-type barrier layers (N$^+$-type bit lines) BL1~BL4 are first formed under the surface of the P-type substrate 10 by photolithography and ion implantation. A plurality of gates (word lines) WL1~WL4 are formed on the P-type substrate 10 by photolithography, chemical vapor deposition and plasma etching, wherein each gate consists of a first oxide layer, a polysilicon layer and a second oxide layer (not shown) from the bottom to the top, and the plurality of word lines WL1~WL4 are perpendicular to the plurality of N$^+$-type bit lines BL1~BL4. Next, nitride spacers (not shown) are formed on both sides of each word line. Based on the program codes provided by a client, code implanted regions 12 are formed by ion implantation. Consequently, an inter-layer oxide (not shown) is formed on the P-type substrate 10, bit lines BL1~BL4, word lines WL1~WL4 by chemical vapor deposition. A plurality of contact windows (not shown) are formed in the inter-layer oxide over the N$^+$-type bit lines BL1~BL4. Thereafter, a patterned aluminum layer (not shown) is formed on the inter-layer layer and contact windows by photolithography, chemical vapor deposition and plasma etching. Finally, a passivation (not shown) is formed on the inter-layer oxide and the patterned aluminum layer.

In the prior ROM process mentioned-above, due to limitations of implanting energy and threshold control, the program codes must be implanted before the inter-layer oxide layer is formed. This lengthens the delivery time of the process.

SUMMARY OF THE INVENTION

In view of the above, the objective of the invention is to provide a method for manufacturing ROMs requiring a shorter delivery time in a semiconductor process. The method for manufacturing ROMs according to the invention, suitable for a substrate, comprises the following steps: First, a plurality of first bit lines are formed under the surface of the substrate by ion implantation. Then, a plurality of gates, each of which consists of a first dielectric layer, a polysilicon layer and a second dielectric layer from the bottom to the top, are formed on the substrate, wherein the gates are perpendicular to said first bit lines. After that, spacers are formed on both sides of each gate. A plurality of second bit lines, parallel to the first bit lines, are formed under the surface of the substrate, wherein each second bit line is discrete under the gates. Next, a third dielectric layer is formed on the substrate, the first bit lines, the second bit lines and the gates. Based on the program codes provided by a client, a plurality of contact windows are formed in the third dielectric layer over each first bit line and corresponding parts of each second bit line, thereby completely setting up the required program codes. Finally, a conductor is formed on the third dielectric layer and the contact windows, then patterning the conductor.

According to the method for manufacturing ROMs of the invention, since each second bit line is discrete under the gates, the program codes provided by a client can be set up by forming a plurality of contact windows in the third dielectric layer over corresponding parts of each second bit line. That is, a logic level "1" or "0" stored in each memory unit is determined by whether there is a corresponding contact window. As can be known from the above, the program codes and contact windows are formed at the same time by using only one mask. Therefore, delivery time of the process is greatly shortened.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
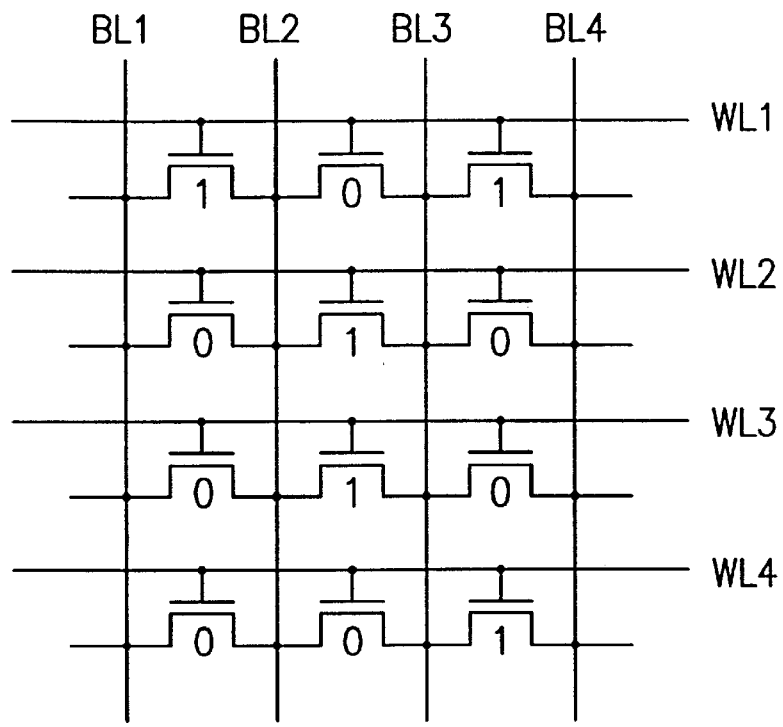
FIG. 1 is a circuit diagram showing a traditional ROM.
Figure 2:
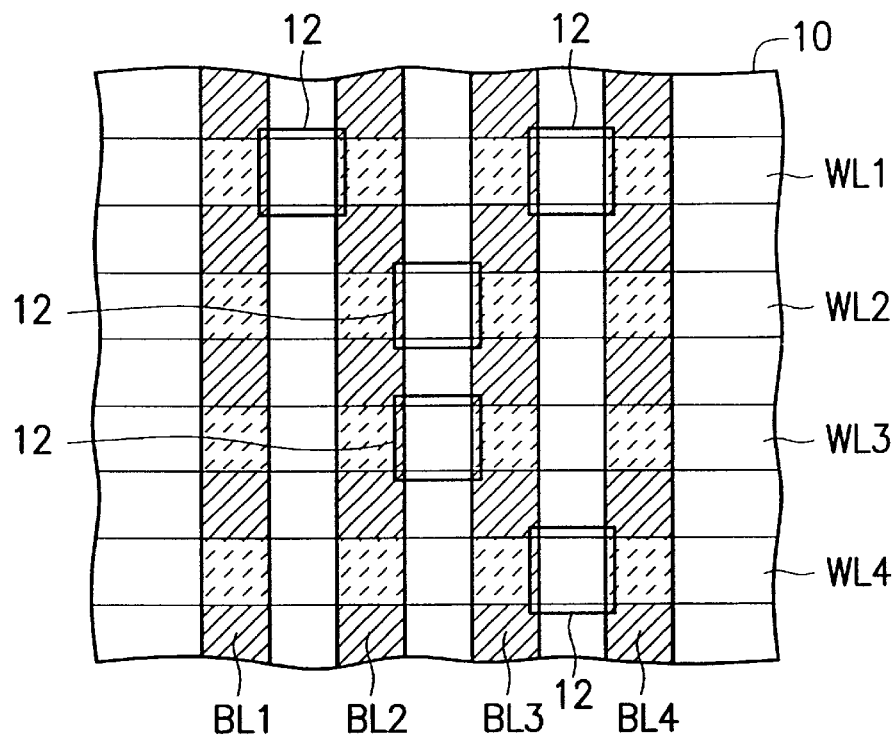
FIG. 2 is a top view showing the structure of the traditional ROM of FIG. 1.
Figure 3A:
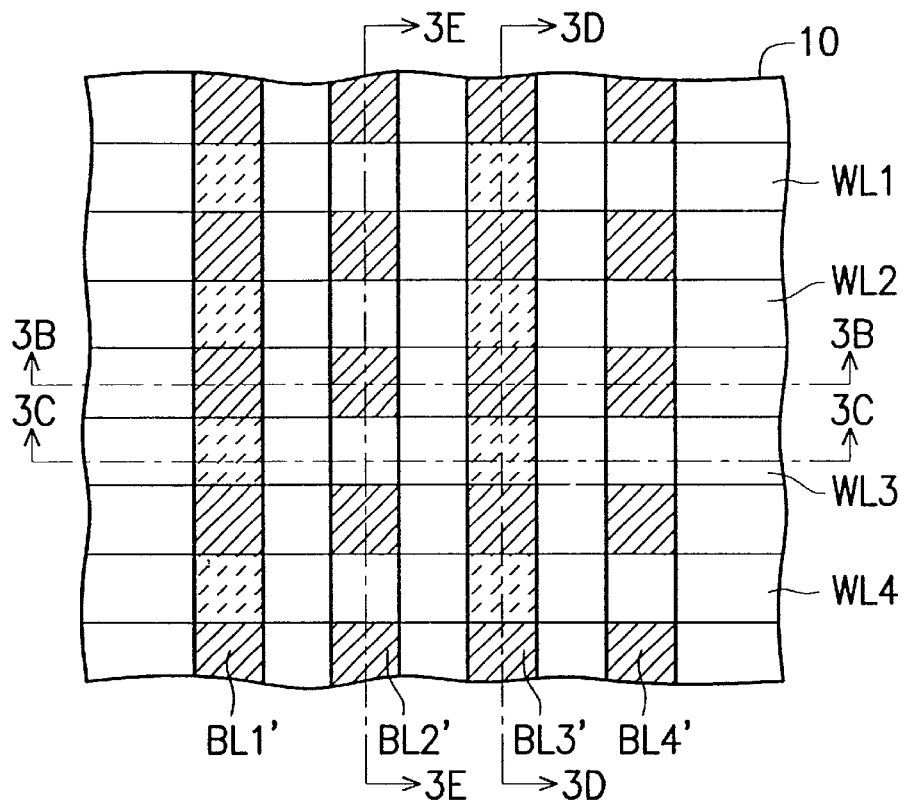
FIG. 3A is a brief top view showing the structure of a ROM manufactured by the invention.
Figure 3B:
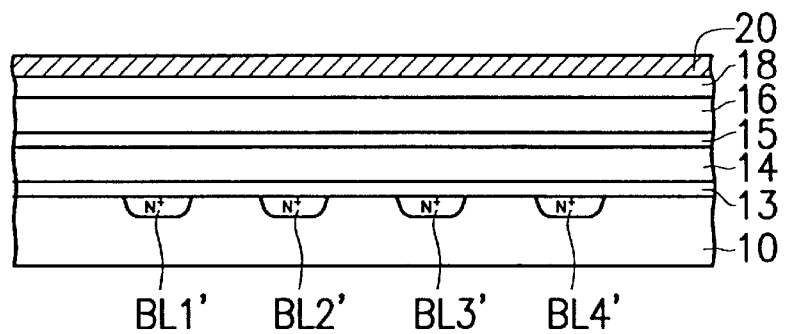
FIG. 3B is a cross-sectional view along line 3B—3B of FIG. 3A.
Figure 3C:
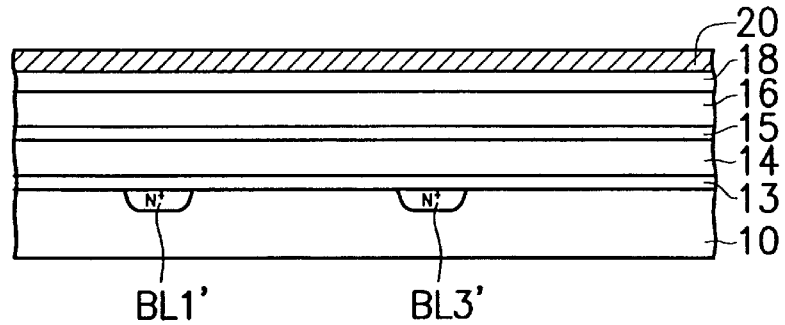
FIG. 3C is a cross-sectional view along line 3C—3C of FIG. 3A.
Figure 3D:
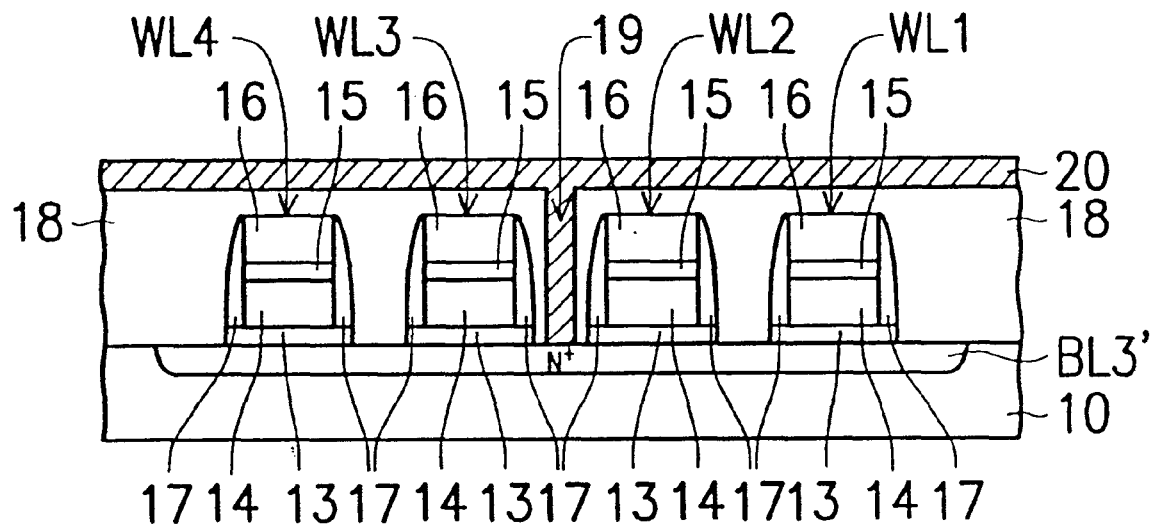
FIG. 3D is a cross-sectional view along line 3D—3D of FIG. 3A.
Figure 3E:
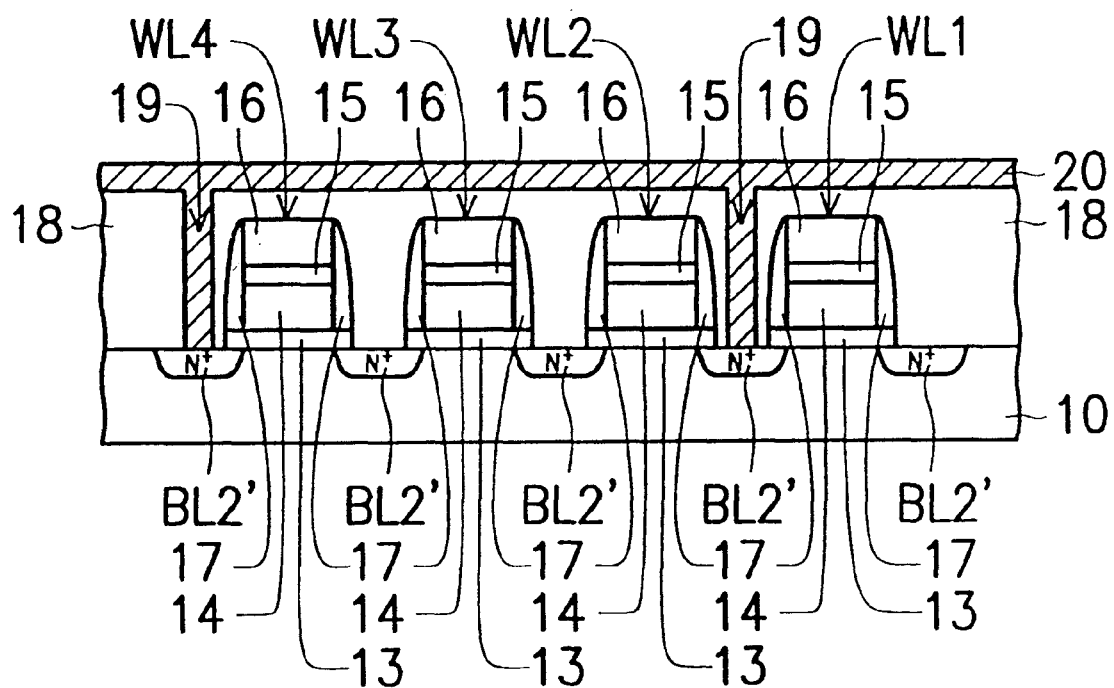
FIG. 3E is a cross-sectional view along line 3E—3E of FIG. 3A.

Referring to FIG. 3A, a brief top view shows the structure of a ROM manufactured by the method of the invention. FIG. 3B is a cross-sectional view along line 3B—3B of FIG. 3A. FIG. 3C is a cross-sectional view along line 3C—3C of FIG. 3A. FIG. 3D is a cross-sectional view along line 3D—3D of FIG. 3A. In FIGS. 3A~3E, reference symbols 10, 13, 14, 15, 17, 18, 19, 20, WL1~WL4, BL1' and BL3' and BL2' and BL2' and BL4' represent a P-type substrate, first oxide layers, polysilicon layers, second oxide layers, silicon nitride layers, nitride spacers, a third oxide layer, contact windows, an aluminum layer, gates (word lines), first N$^+$-type bit lines and second N$^+$-type bit lines.

As shown in FIGS. 3A~3E, in a method for manufacturing ROMs according to the invention, a plurality of first N$^+$-type bit lines BL1' and BL3' (just two of them shown) are first formed under the surface of a P-type substrate 10 by photolithography and ion implantation. Then, a plurality of gates (word lines) WL1~WL4 (just four of them shown), each of which consists of a first oxide layer 13, a polysilicon layer 14, a second oxide layer 15, and a silicon nitride 16 from the bottom to the top, are formed on the P-type substrate 10 by photolithography, chemical vapor deposition and plasma etching, wherein the gates WL1~WL4 are perpendicular to the first N$^+$-type bit lines BL1' and BL3'. Thereafter, nitride spacers 17 are formed on both sides of each gate by chemical vapor deposition and back etching. A plurality of second N$^+$-type bit lines BL2' and BL4' (just two of them shown), parallel to the first N$^+$-type bit lines BL1' and BL3', are formed under the surface of the P-type substrate 10 by photolithography and ion implantation, wherein each second $N^+$-type bit line is discrete under the gates WL1~WL4. Next, a third oxide layer 18 is formed on the P-type substrate 10, the first $N^+$-type bit lines BL1' and BL3', the second $N^+$-type bit lines BL2' and BL4' and the gates WL1~WL4 by chemical vapor deposition. Based on the program codes provided by a client, a plurality of contact windows 19 are formed in the third oxide layer 18 over each first $N^+$-type bit line and corresponding parts of each second $N^+$-type bit line by photolithography and plasma etching, thereby completely setting up the required program codes. After that, an aluminum layer 20 is formed on the third oxide layer 18 and the contact windows 19 by chemical vapor deposition, then the aluminum layer 20 is patterned by plasma etching. Finally, a passivation (not shown) is formed on the third oxide layer 18 and the patterned aluminum layer 20.

According to the method for manufacturing ROMs of the invention, since each second bit line is discrete under the gates, the program codes provided by a client can be concurrently set up by forming a plurality of contact windows 19 in the third oxide layer 18 over corresponding parts of each second $N^+$-type bit line. That is, a logic level "1" or "0" stored in each memory unit is determined by whether there is a corresponding contact window. As can be known from the above, the program codes and contact windows are formed at the same time by using only one mask. Therefore, the delivery time required by the process is greatly shortened.

In addition, since the silicon nitride layer 16 formed on the second oxide layer 15 functions as an etching stop, the second oxide layers 15 can not be etched, even though the formed contact windows are shifted to over parts of the gates WL1~WL4. So, any short circuit between $N^+$-type bit lines BL1'~BL4' and gates (word lines) WL1~WL4 can be efficiently prevented.

Although the invention has been disclosed in terms of a preferred embodiment, the disclosure is not intended to limit the invention. Those knowledgeable in the art can make modifications within the scope and spirit of the invention which is determined by the claims appended below.

What is claimed is:

1. A method for manufacturing ROMs in a semiconductor process, suitable for a substrate, comprising:
    forming a plurality of first bit lines under the surface of said substrate by ion implantation;
    forming a plurality of gates, each of which consists of a first dielectric layer, a polysilicon layer and a second dielectric layer from the bottom to the top, on said substrate, wherein said gates are perpendicular to said first bit lines;
    forming spacers on both sides of each gate;
    forming a plurality of second bit lines, parallel to said first bit lines, under the surface of said substrate, wherein each second bit line is discrete under said gates;
    forming a third dielectric layer on said substrate, said first bit lines, said second bit lines and said gates;
    forming a plurality of contact windows in said third dielectric layer over each first bit line and parts of each second bit line; and
    forming a conductor on said third dielectric layer and said contact windows, then patterning said conductor.

2. A method for manufacturing ROMs in a semiconductor process as claimed in claim 1, further comprising forming an etching stop on said second dielectric layer.

3. A method for manufacturing ROMs in a semiconductor process as claimed in claim 2, wherein said etching stop is a silicon nitride layer.

4. A method for manufacturing ROMs in a semiconductor process as claimed in claim 1, wherein said substrate is a P-type substrate.

5. A method for manufacturing ROMs as claimed in claim 4, wherein said first bit lines are $N^+$-type bit lines.

6. A method for manufacturing ROMs in a semiconductor process as claimed in claim 4, wherein said second bit lines are $N^+$-type bit lines.

7. A structure for manufacturing ROMs in a semiconductor process, suitable for a substrate, comprising:
    a plurality of first bit lines formed under the surface of said substrate by ion implantation;
    a plurality of said gates, each of which consists of a first dielectric layer, a polysilicon layer and a second dielectric layer from the bottom to the top, formed on said substrate;
    spacers formed on both sides of each gate;
    a plurality of second bit lines, parallel to said first bit lines, formed under the surface of said substrate by ion implantation, wherein each second bit line is discrete under said gates;
    a third dielectric layer formed on said substrate, said first bit lines, said second bit lines and said gates;
    a plurality of contact windows formed in said third dielectric layer over each bit line and parts of each second bit line; and
    a patterned conductor formed on said contact windows and said third dielectric layer.

8. A structure for manufacturing ROMs in a semiconductor process as claimed in claim 7, further comprising an etching stop formed on said second dielectric layer.

9. A structure for manufacturing ROMs in a semiconductor process as claimed in claim 8, wherein said etching stop is a silicon nitride layer.

10. A structure for manufacturing ROMs in a semiconductor process as claimed in claim 7, wherein said substrate is a P-type substrate.

11. A structure for manufacturing ROMs in a semiconductor process as claimed in claim 10, wherein said first bit lines are $N^+$-type bit lines.

12. A structure for manufacturing ROMs in a semiconductor process as claimed in claim 10, wherein said second bit lines are $N^+$-type bit lines.

13. The method according to claim 1, wherein all the contact windows are formed at the same time by using one mask.

14. The method according to claim 1, wherein program codes provided by a client are adapted to be concurrently set up by forming the plurality of contact windows in the third dielectric layer to greatly shorten delivery time of the process of manufacturing the ROMs.

15. A method for manufacturing ROMs in a semiconductor process, suitable for a substrate, comprising:
    forming a plurality of first bit lines under the surface of said substrate by ion implantation;
    forming a plurality of gates, each of which consists of a first dielectric layer, a polysilicon layer and a second dielectric layer from the bottom to the top, on said substrate, wherein said gates are perpendicular to said first bit lines;
    forming spacers on both sides of each gate;
    forming a plurality of second bit lines, parallel to said first bit lines, under the surface of said substrate, wherein each second bit line is discrete under said gates;
    forming a third dielectric layer on said substrate, said first bit lines, said second bit lines and said gates;
    programming the ROMs by selectively forming a plurality of contact windows in said third dielectric layer over each first bit line and ports of each second bit line; and
    forming a conductor on said third dielectric layer and said contact windows, then patterning said conductor.

* * * * *